(12) United States Patent
Takahashi et al.

(10) Patent No.: US 8,944,833 B2
(45) Date of Patent: Feb. 3, 2015

(54) CARD CONNECTOR AND ELECTRONIC APPARATUS

(71) Applicant: Fujitsu Limited, Kawasaki (JP)

(72) Inventors: Koki Takahashi, Kawasaki (JP); Kazuya Orui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 144 days.

(21) Appl. No.: 13/679,333

(22) Filed: Nov. 16, 2012

(65) Prior Publication Data

US 2013/0260583 A1    Oct. 3, 2013

(30) Foreign Application Priority Data

Mar. 29, 2012 (JP) ................. 2012-075596

(51) Int. Cl.
*H01R 13/62* (2006.01)
*H05K 5/02* (2006.01)

(52) U.S. Cl.
CPC .................... *H05K 5/0295* (2013.01)
USPC ........................................................ 439/159

(58) Field of Classification Search
USPC .................. 439/152, 157, 159, 630
See application file for complete search history.

(56) References Cited

U.S. PATENT DOCUMENTS

| | | | | |
|---|---|---|---|---|
| 6,033,244 A * | 3/2000 | Nishioka | ....................... | 439/159 |
| 6,116,929 A * | 9/2000 | Muramatsu | .................... | 439/159 |
| 6,120,309 A * | 9/2000 | Hara | ............................... | 439/159 |
| 6,210,188 B1 * | 4/2001 | Chang | ........................... | 439/159 |
| 6,669,493 B2 * | 12/2003 | Kuroda | ........................ | 439/159 |
| 6,817,874 B2 * | 11/2004 | Okabe | ............................. | 439/157 |
| 7,179,104 B2 * | 2/2007 | Wada et al. | ................... | 439/159 |
| 7,534,116 B2 * | 5/2009 | Ho | .................................. | 439/159 |
| 7,632,117 B1 * | 12/2009 | Van der Steen | ............... | 439/159 |
| 7,811,106 B2 * | 10/2010 | Lin et al. | ....................... | 439/159 |

FOREIGN PATENT DOCUMENTS

| JP | 3051440 | 6/1998 |
|---|---|---|
| JP | 3051440 | 8/1998 |
| JP | 2000-195614 | 7/2000 |
| JP | 2002-352910 | 12/2002 |

\* cited by examiner

*Primary Examiner* — Vanessa Girardi
(74) *Attorney, Agent, or Firm* — Staas & Halsey LLP

(57) ABSTRACT

A card connector includes: a housing to receive a card; a sliding member to slide together with the card in a range including a first position, a second position and a third position, the sliding member being locked to the housing at the first position, the sliding member is unlocked from the housing at the second position, the card being removable at the third position; a rotary member, rotatably supported by the sliding member, to press the card in a card ejection direction; a lock mechanism to lock the sliding member in the first position to the housing and unlock the sliding member from the housing by sliding of the sliding member from the first position to the second position; a first biasing member to bias the sliding member in the card ejection direction; a second biasing member to bias the rotary member in the card ejection direction.

16 Claims, 21 Drawing Sheets

CARD CONNECTOR AND ELECTRONIC APPARATUS

CROSS-REFERENCE TO RELATED APPLICATION(S)

This application is based upon and claims the benefit of priority of the prior Japanese Patent Application No. 2012-75596, filed on Mar. 29, 2012, the entire contents of which are incorporated herein by reference.

FIELD

The embodiments discussed herein are related to a card connector and an electronic apparatus.

BACKGROUND

An electronic apparatus, such as a mobile phone, a personal computer, a digital camera, or a printer, is equipped with a connector for a card, such as a memory card. In such a card connector, a user presses a card to insert or eject the card.

In such a card connector, a card is ejected by an eject lever that rotates and operates on the principle of leverage.

Japanese Laid-open Patent Publication Nos. 2002-352910 and 2000-195614 and Japanese Registered Utility Model No. 3,051,440 discuss related arts.

SUMMARY

According to one aspect of the embodiments, a card connector includes: a housing configured to receive a card; a sliding member configured to slide together with the card in a range including a first position, a second position and a third position, the sliding member being locked to the housing at the first position, the sliding member is unlocked from the housing at the second position, the card being removable at the third position; a rotary member, rotatably supported by the sliding member, configured to press the card in a card ejection direction; a lock mechanism configured to lock the sliding member in the first position to the housing and unlock the sliding member from the housing by sliding of the sliding member from the first position to the second position; a first biasing member configured to bias the sliding member in the card ejection direction; and a second biasing member configured to bias the rotary member in the card ejection direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the case where the amount of ejection of a card when the card is ejected is increased so that a user can easily remove the card from a card connector, a sliding member, which slides together with the card, protrudes from a housing which accommodates the card.

Figure 1:
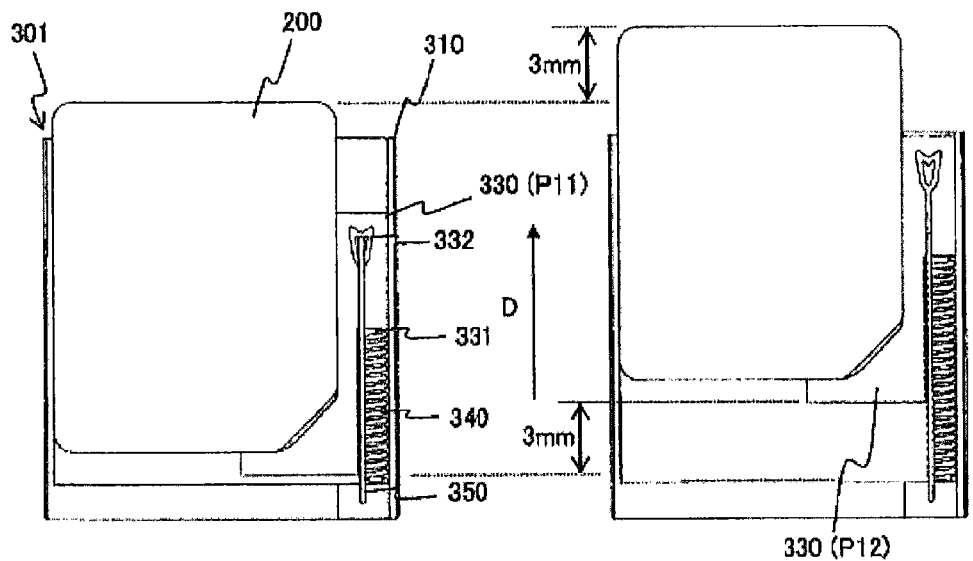
FIG. 1 illustrates an exemplary plan view of a card connector.

FIG. 1 illustrates an exemplary plan view of a card connector. FIG. 1 illustrates the card connector 301 in a card locked state and in a card ejected state. The card connector 301 includes a housing 310 that receives a card 200, a sliding member 330 that slides together with the card 200, a coil spring 340 that biases the sliding member 330 relative to the housing 310 in a card ejection direction D, and a pin 350.

The sliding member 330 includes a spring-wound pin 331 to be wound with the coil spring 340 and a heart cam groove 332 engaged with the pin 350. The heart cam groove 332 and the pin 350 lock the sliding member 330 to the housing 310.

To eject the card 200, the user presses the card 200, thus allowing the heart cam groove 332 and the pin 350 to unlock the sliding member 330. Consequently, the sliding member 330 slides from a locked position P11 to an ejection position P12, so that the card 200 is ejected. For example, in the case where the amount of ejection of the card 200 is 3 mm, the amount of sliding of the sliding member 330 may be 3 mm.

Figure 2:
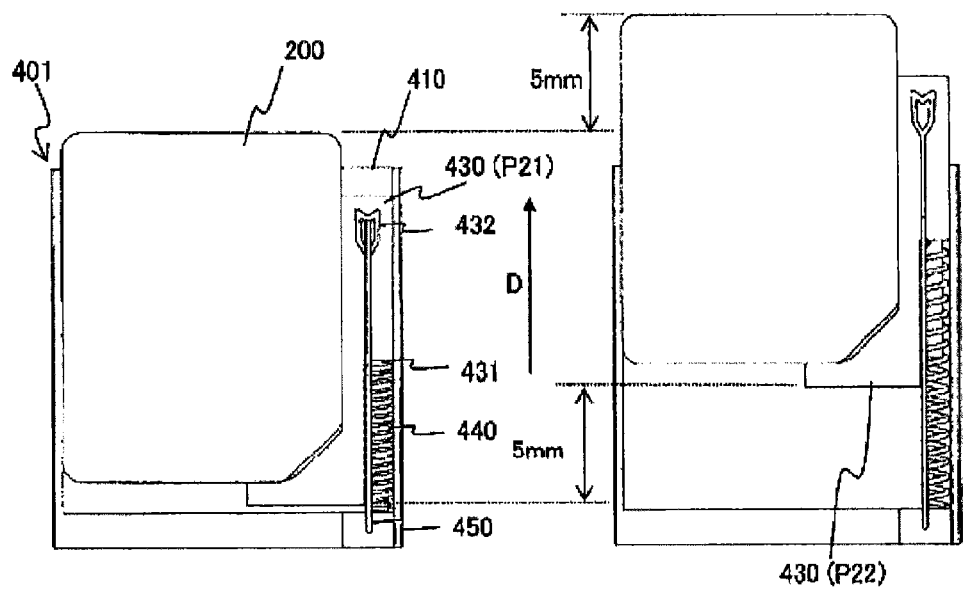
FIG. 2 illustrates an exemplary plan view of a card connector.

FIG. 2 illustrates an exemplary plan view of a card connector. FIG. 2 illustrates the card connector 401 in a card locked state and in a card ejected state. The card connector 401 includes a housing 410, a sliding member 430, a coil spring 440, and a pin 450 similar to the card connector 301 in FIG. 1. The sliding member 430 includes a spring-wound pin 431 and a heart cam groove 432 and slides between a locked position P21 and an ejection position P22, similar to the sliding member 330 in FIG. 1.

Figure 3:
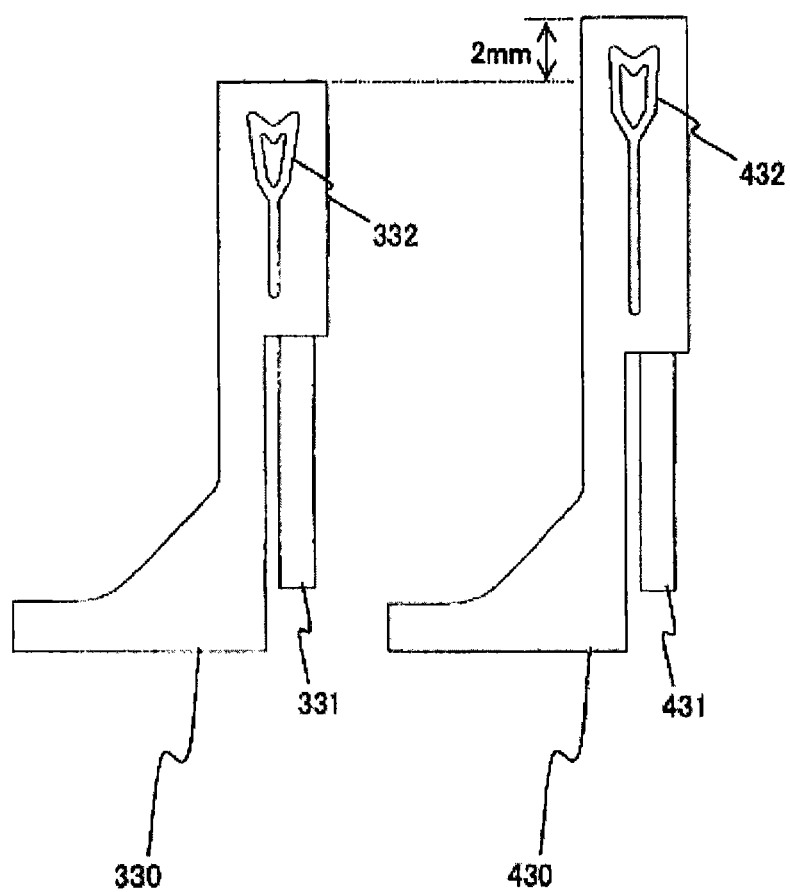
FIG. 3 illustrates an exemplary sliding member of a card connector.

FIG. 3 illustrates an exemplary sliding member of a card connector. In the card connector 401 of FIG. 2, the amount of ejection (hereinafter, referred to as the "ejection amount") of the card and the amount of sliding (hereinafter, referred to as the "sliding amount") of the sliding member 430 may be 5 mm. In the case where the ejection amount of the card 200 is changed from 3 mm to 5 mm, the heart cam groove 432 is longer than the heart cam groove 332 by 2 mm. Accordingly, the sliding member 430 may be longer than the sliding member 330 by 2 mm, as illustrated in FIG. 3.

Figure 4:
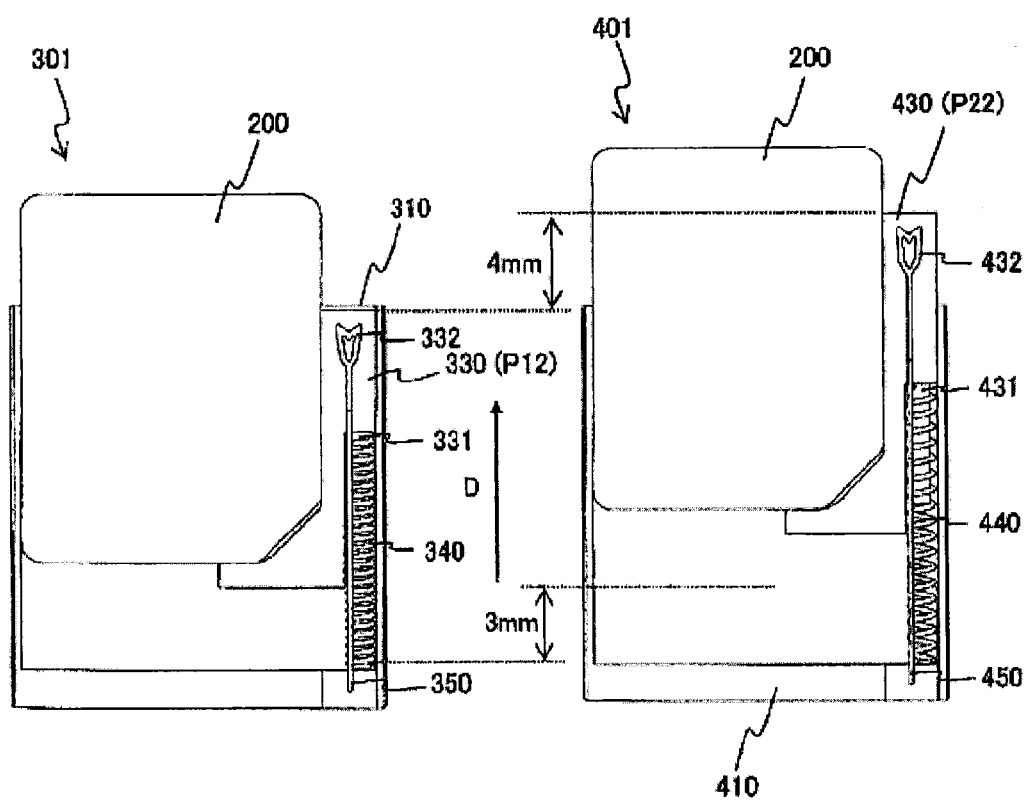
FIG. 4 illustrates an exemplary card ejection in a card connector.

FIG. 4 illustrates an exemplary card ejection in a card connector. Since the ejection amount of the card 200 is increased from 3 mm to 5 mm, the sliding amount (5 mm) of the sliding member 430 is longer than the sliding amount (3 mm) of the sliding member 330 by 2 mm.

As illustrated in FIG. 4, therefore, the sliding member 430 of the card connector 401 protrudes by 4 mm more than the card connector 301.

To reduce contact caused by protrusion of the sliding member 430 from the housing 410, the ejection amount of the card 200 may be increased to an extent that would allow the sliding member 430 not to protrude from the housing 410.

Figure 5:
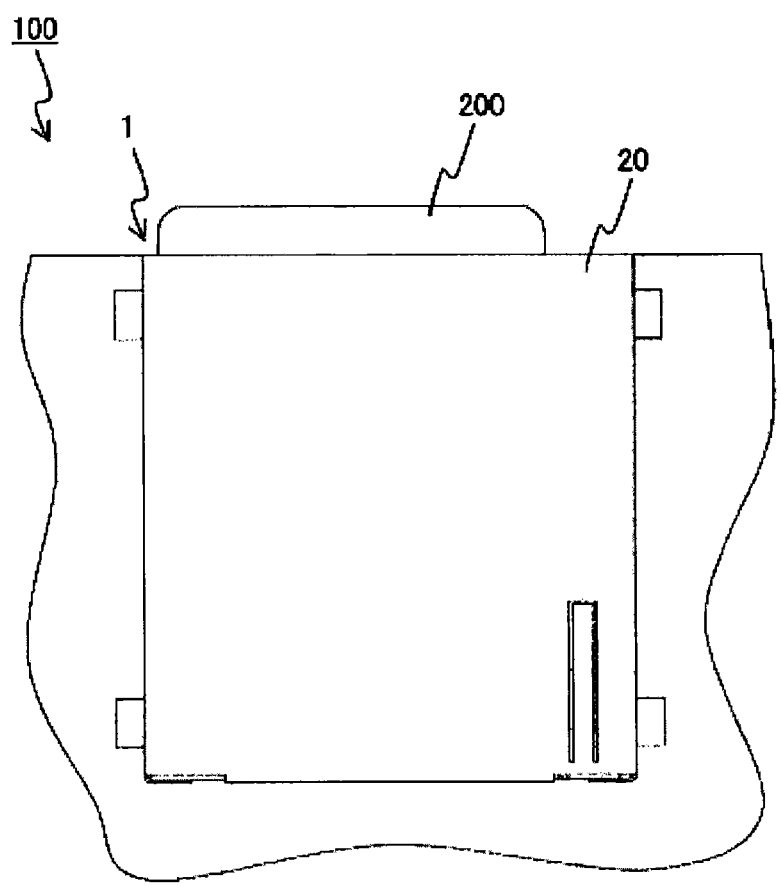
FIG. 5 illustrates an exemplary plan view of an electronic apparatus.
Figure 6:
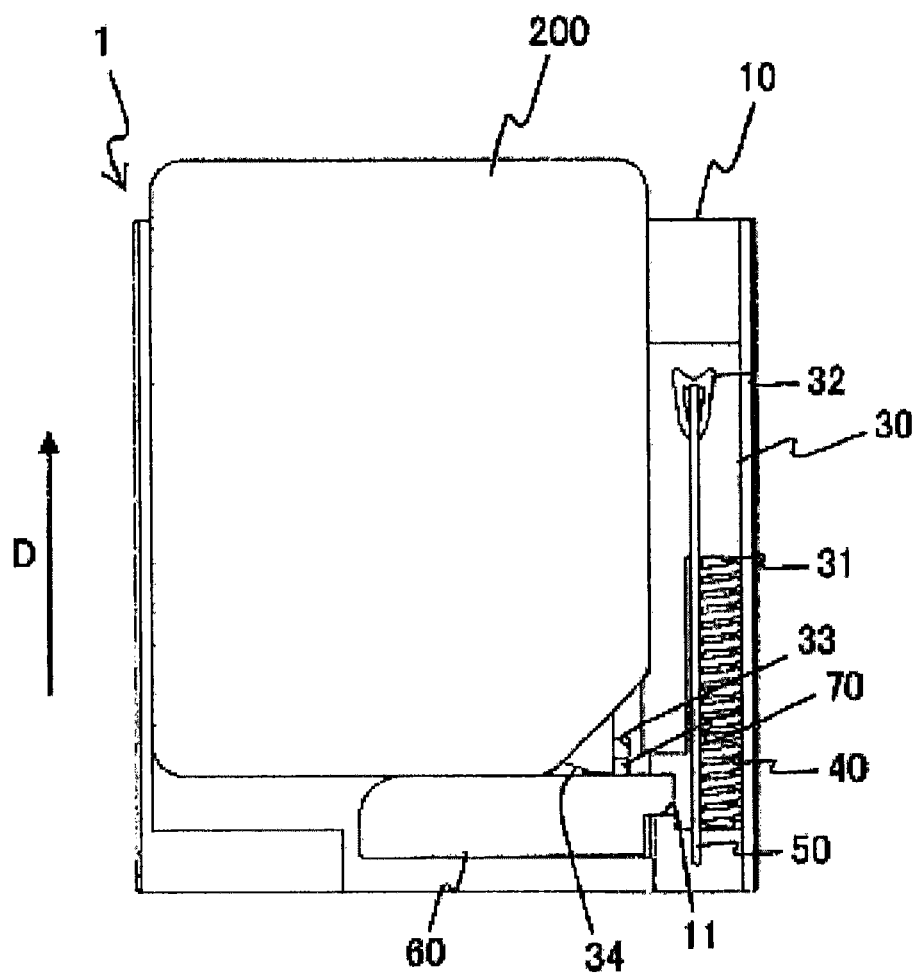
FIG. 6 illustrates an exemplary plan view of a card connector.
Figure 7A:
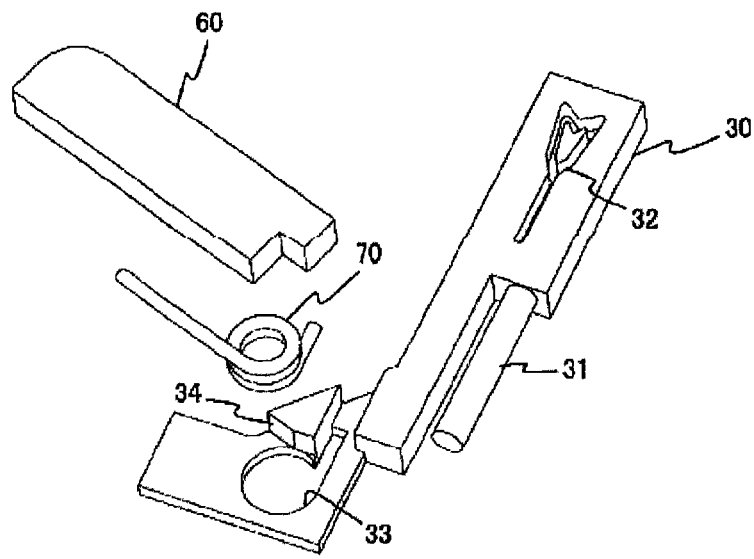
FIGS. 7A and 7B illustrate an exemplary exploded perspective view of a sliding member and a rotary member.
Figure 7B:
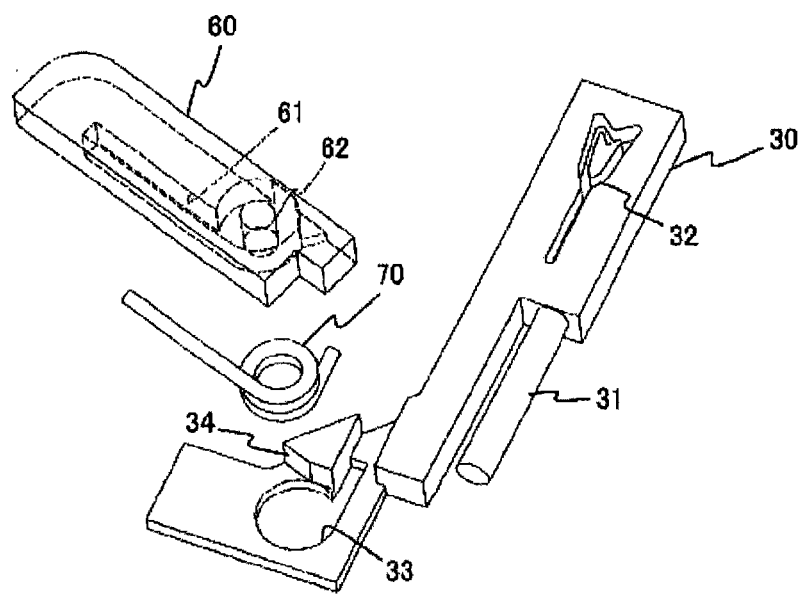
Figure 8:
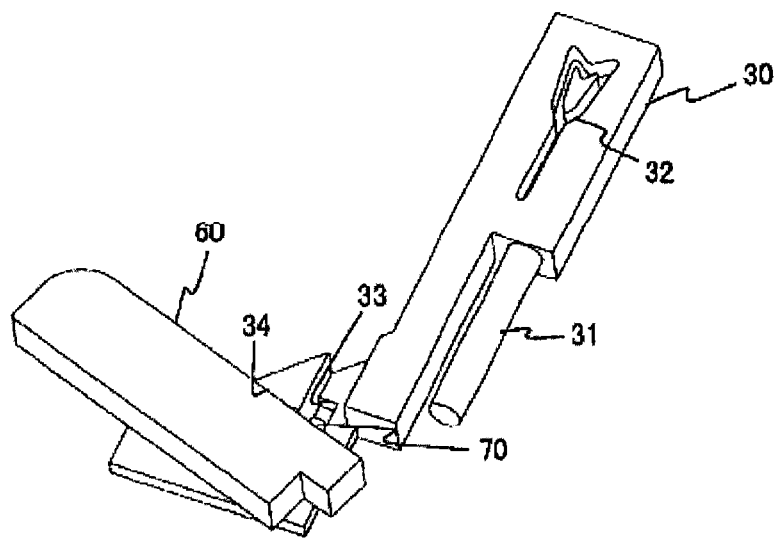
FIG. 8 illustrates a perspective view of a sliding member and a rotary member.
Figure 9:
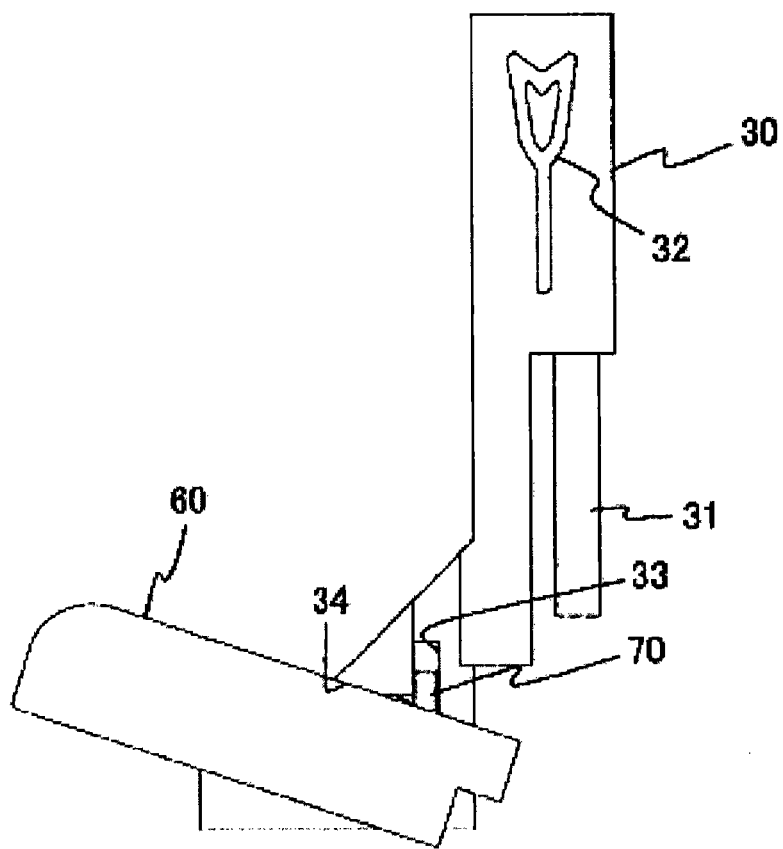
FIG. 9 illustrates an plan view of a sliding member and a rotary member.

FIG. 5 illustrates an exemplary plan view of an electronic apparatus. The electronic apparatus of FIG. 5 includes a card connector 1. FIG. 6 illustrates an exemplary plan view of a card connector 1. An internal structure of the card connector 1 may be illustrated in plan view in FIG. 6. FIGS. 7A and 7B illustrate an exemplary exploded perspective view of a sliding member and a rotary member. An internal structure of the sliding member may be illustrated in exploded perspective view in FIG. 7B. FIG. 8 illustrates an exemplary perspective view of a sliding member and a rotary member. FIG. 9 illustrates an exemplary plan view of a sliding member and a rotary member.

Referring to FIG. 5, the electronic apparatus 100 includes the card connector 1. In the card connector 1 in a state in which the card 200 is received and locked in the card connector 1, the card 200 partly protrudes from a housing 10 illustrated in FIG. 6 and a shell 20 illustrated in FIG. 5. The card 200 protrudes so that the user presses the card 200 to eject the card 200, though the user presses the card 200 to insert it. When the user presses the card 200, the card 200 is unlocked, so that the card 200 is ejected.

The electronic apparatus 100 may be any apparatus including the card connector 1, for example, a mobile phone, a personal computer, a digital camera, or a printer. The card 200 may be a memory card, such as a micro subscriber identity module (SIM) card. The card 200 may be a card other than a memory card, for example, an IC card.

Referring to FIG. 6, the card connector 1 includes the housing 10, the shell 20 (refer to FIG. 5), the sliding member indicated at 30, a coil spring 40 which may correspond to a first biasing member, a pin 50, the rotary member 60, and a torsion spring 70 which may correspond to a second biasing member.

The housing 10 receives the card 200. Assuming that an insertion port for the card 200 is positioned at the front of the card connector 1, the housing 10 includes a part positioned in a bottom surface of the card connector 1 and parts positioned in right and left side surfaces thereof. The housing 10 may include a part corresponding to a rear surface of the card connector 1.

The housing 10 further includes a lock stopper 11. The lock stopper 11 abuts against the rotary member 60 in a card locked state, as illustrated in FIG. 6, to restrict rotation of the rotary member 60 in the card ejection direction D. The lock stopper 11 may be disposed in an immovable component similar to the housing 10, for example, the shell 20.

The shell 20 accommodates the card 200 in conjunction with the housing 10. The shell 20 is positioned in at least an upper surface of the card connector 1. Referring to FIGS. 7A to 9, the sliding member 30 includes a spring-wound pin 31, a heart cam groove 32, a spring receiving portion 33, and an ejection restricting stopper 34. The sliding member 30 abuts against a first end (right end in FIG. 6) in a width direction of the card 200 and slides together with the card 200.

The coil spring 40, which is positioned between the sliding member 30 and the housing 10, is wound around the spring-wound pin 31. The coil spring 40 may be a helical compression spring that biases the sliding member 30 in the card ejection direction D.

The pin 50 fastened to the housing 10 is engaged with the heart cam groove 32. The heart cam groove 32 and the pin 50 may correspond to a lock mechanism that locks the sliding member 30 to the housing 10. If the pin 50 is fastened to the shell 20, the sliding member 30 would be locked to the housing 10, since the shell 20 and the housing 10 are fastened to each other.

The spring receiving portion 33 may be a hole or recess that receives the torsion spring 70 in conjunction with a spring receiving portion 61. The spring receiving portion 33 receives lower part of a coil of the torsion spring 70 and a first arm thereof. The ejection restricting stopper 34 abuts against the rotary member 60 when the card 200 is ejected, thus restricting rotation of the rotary member 60 in the card ejection direction D.

Referring to FIG. 7B, the rotary member 60 includes the spring receiving portion 61 and a protrusion 62. The spring receiving portion 61 may be a recess or hole that receives the torsion spring 70 in conjunction with the spring receiving portion 33. The spring receiving portion 61 receives upper part of the coil of the torsion spring 70 and a second arm (positioned on the opposite side of the coil from the first arm received in the spring receiving portion 33).

The protrusion 62 may correspond to a rotation axis of the rotary member 60. The protrusion 62 is surrounded by part (recess), which receives the coil of the torsion spring 70, of the spring receiving portion 61, such that the protrusion 62 extends downward beyond the spring receiving portion 61. The protrusion 62 is inserted into the coil of the torsion spring 70 from above. The protrusion 62 is positioned closer to the sliding member 30 than the middle in the width direction of the card 200.

The rotary member 60 rotates about the protrusion 62 and presses middle part in the width direction of the card 200 at a second end of the card 200 closer to an innermost portion of the housing 10 to eject the card 200 in the card ejection direction D, the innermost portion being on an opposite direction side to the card ejection direction D. The torsion spring 70 biases the rotary member 60 in the card ejection direction D, or clockwise in FIG. 6 relative to the sliding member 30.

FIGS. 10A to 10D illustrate an exemplary plan view of a card connector. FIGS. 10A to 10D illustrate the internal structure of the card connector 1 shifted from the card locked state to a card ejected state in plan view. FIG. 11 illustrates an exemplary perspective view of a card connector. The internal structure of the card connector 1 in the card locked state is illustrated in perspective view in FIG. 11.

Figure 10A:
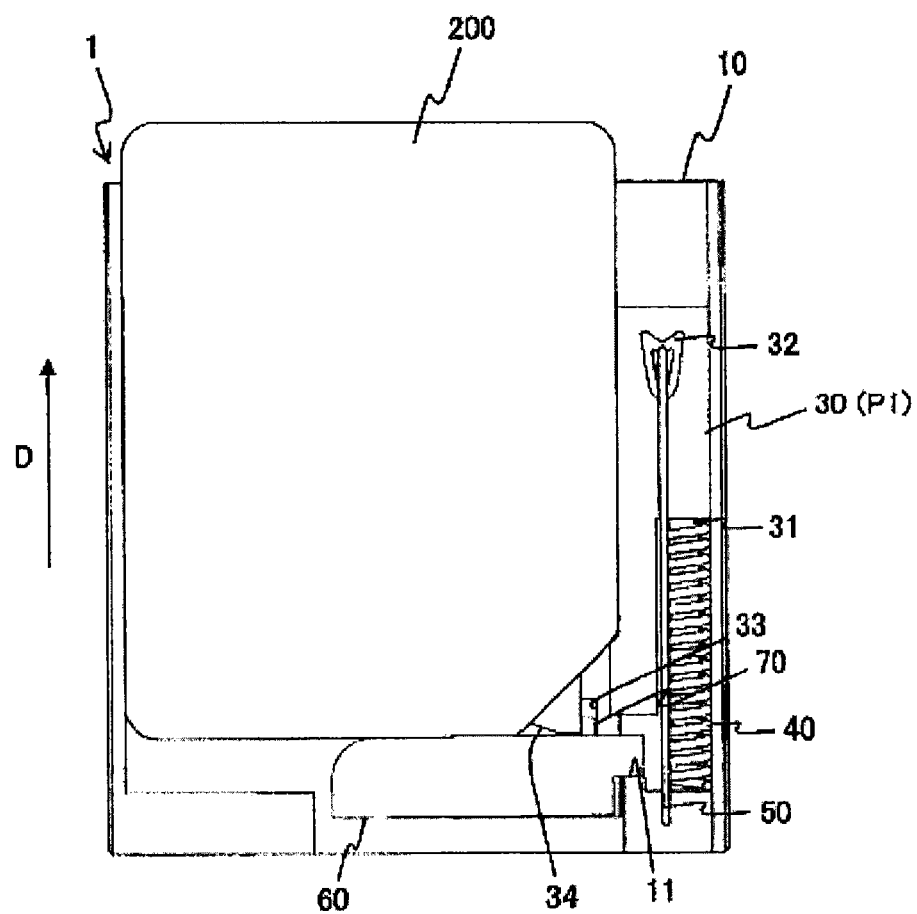
FIGS. 10A to 10D illustrate a plan view of a card connector.
Figure 11:
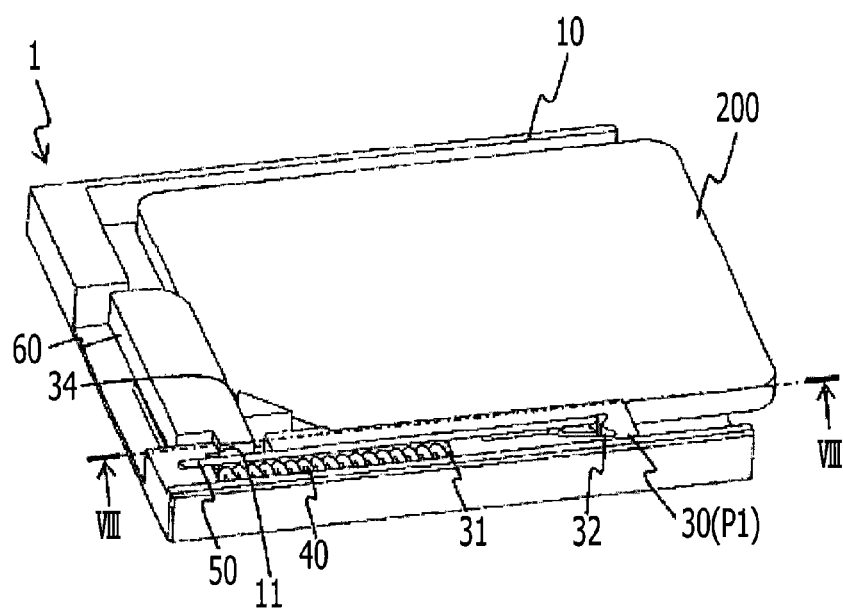
FIG. 11 illustrates a perspective view of a card connector.

In the card connector 1 in the card locked state illustrated in FIGS. 10A and 11, the pin 50 is engaged with the heart cam groove 32, so that the sliding member 30 is locked to the housing 10 (first position P1). In this state, the sliding member 30 abuts against the card 200. When the card 200 is pressed in order to eject the card 200, therefore, the sliding member 30 is also pressed through the card 200.

Figure 12:
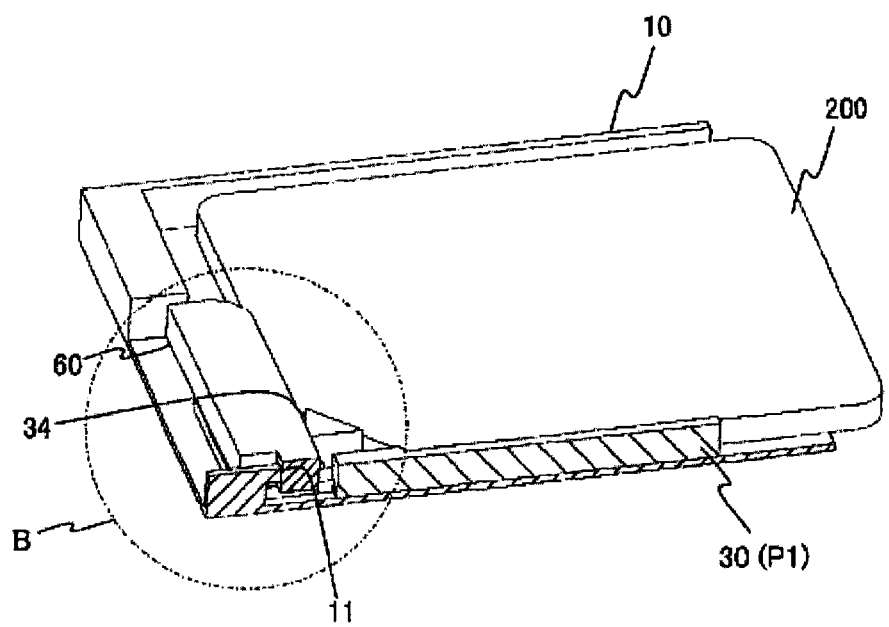
FIG. 12 illustrates a partly sectioned view of a card connector.
Figure 13:
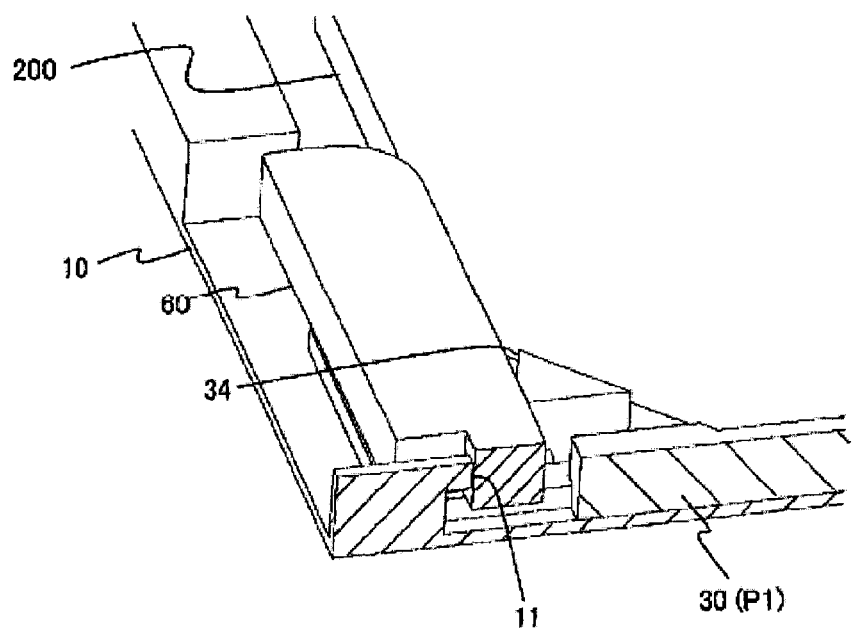
FIG. 13 illustrates a partly sectioned view of a card connector.
Figure 14:
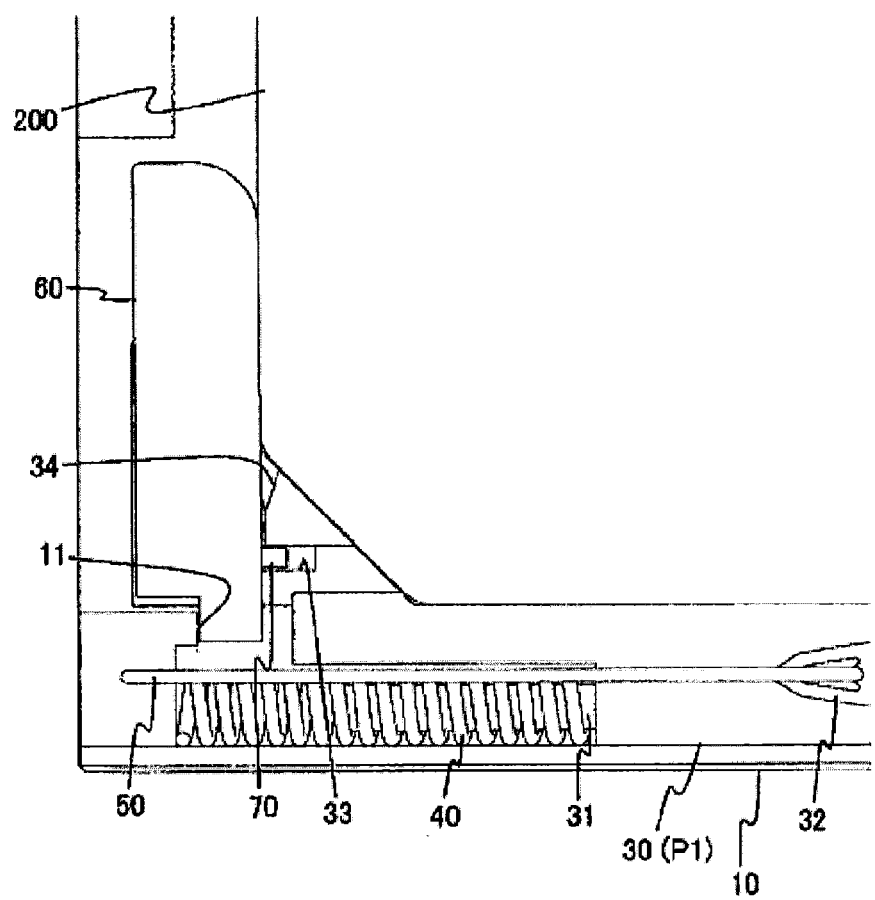
FIG. 14 illustrates a plan view of a lock stopper.
Figure 15:
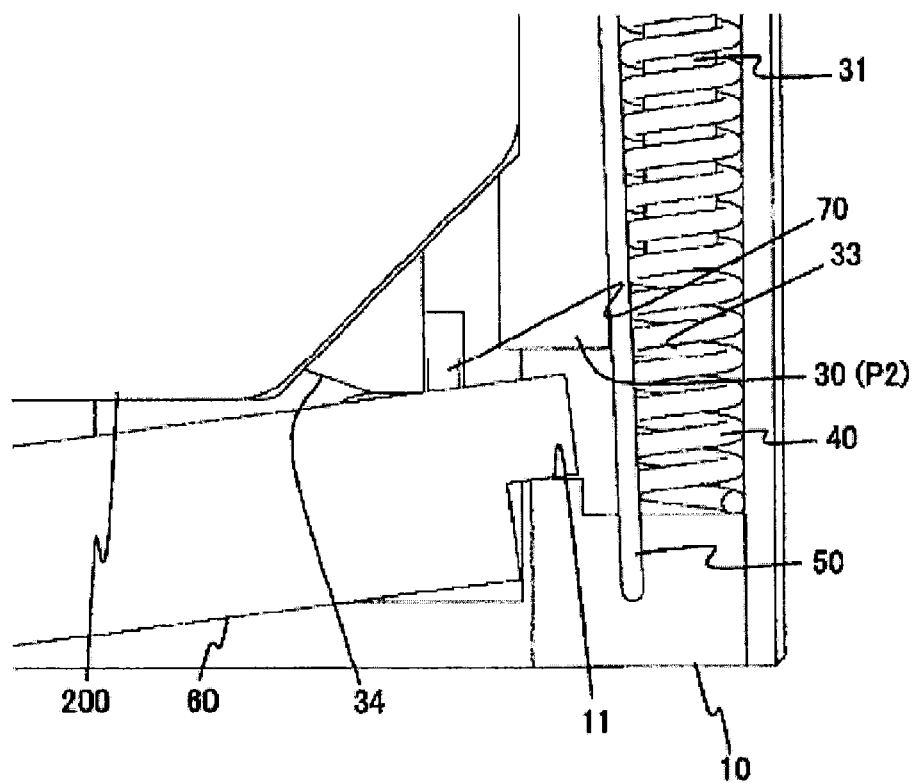
FIG. 15 illustrates a plan view of part of a card connector.
Figure 16:
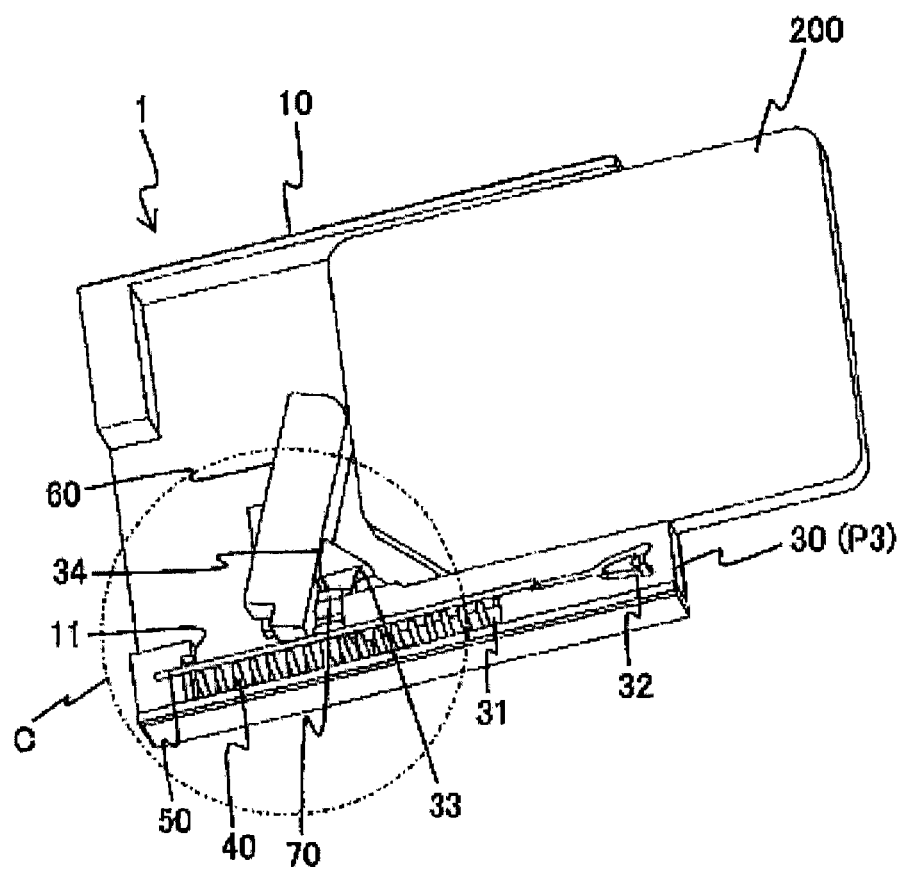
FIG. 16 illustrates a perspective view of a card connector.
Figure 17:
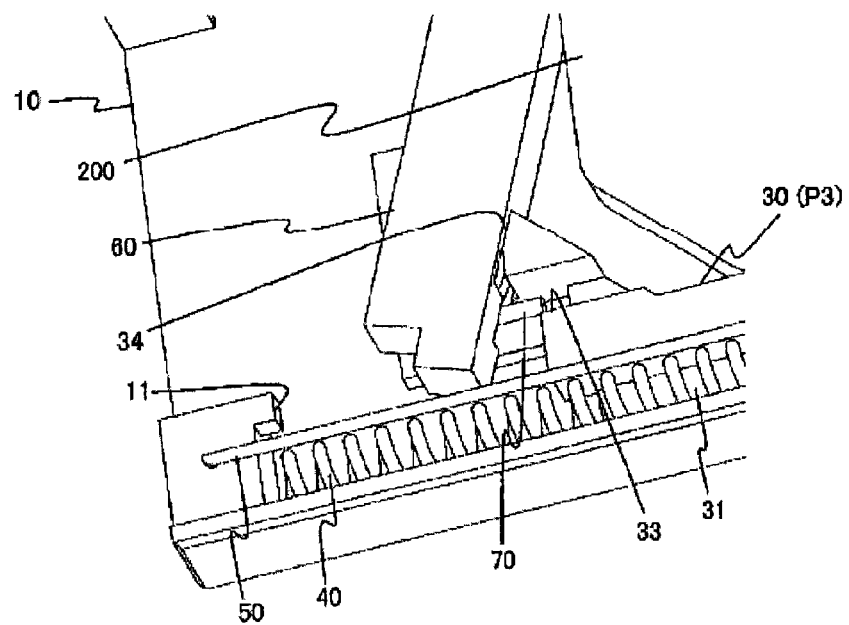
FIG. 17 illustrates a perspective view of part of a card connector.

FIG. 12 illustrates an exemplary partly sectioned view of a card connector. FIG. 12 illustrates a cross-section taken along the line XII-XII in FIG. 11. FIG. 13 illustrates an exemplary partly sectioned view of a card connector. FIG. 13 illustrates an enlarged view of part B in FIG. 12. FIG. 14 illustrates an exemplary plan view of a lock stopper. FIG. 15 illustrates an exemplary plan view of a card connector. FIG. 15 illustrates an enlarged view of part A in FIG. 10B. FIG. 16 illustrates an exemplary perspective view of a card connector. The internal structure of the card connector 1 is illustrated in perspective view in FIG. 16. FIG. 17 illustrates an exemplary perspective view of a card connector. FIG. 17 illustrates an enlarged view of part C in FIG. 16. In the card connector 1 in the card locked state, the rotary member 60 abuts against the lock stopper 11 such that the rotation of the rotary member 60 in the card ejection direction D is restricted. Accordingly, the rotary member 60 does not press the card 200 in the card ejection direction D.

Figure 10B:
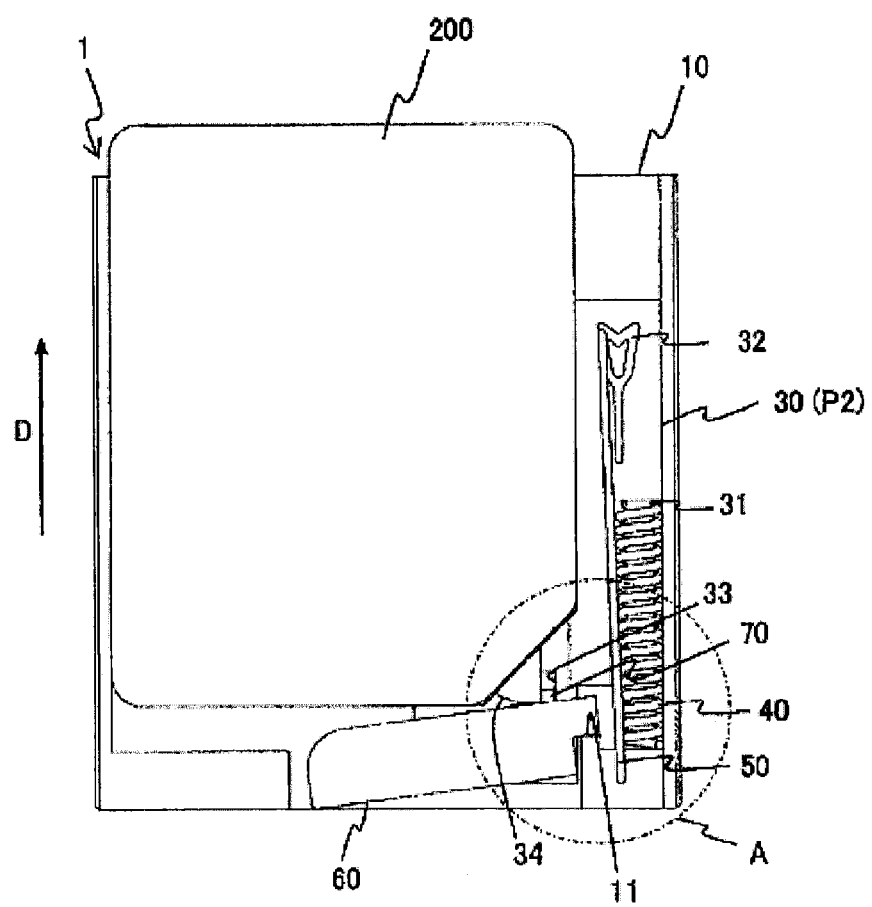

In the card connector 1 in an unlocked state illustrated in FIG. 10B, pressing of the card 200 by the user allows the sliding member 30 to slide toward the innermost portion of the housing 10 in a direction opposite to the card ejection direction D (second position P2).

The sliding member 30 slides from the first position P1 (refer to FIG. 10A) to the second position P2 (refer to FIG. 10B), so that the sliding member 30 locked to the housing 10 by the pin 50 and the heart cam groove 32 is unlocked from the housing 10.

Sliding of the sliding member 30 from the first position P1 to the second position P2 causes the rotary member 60 to slide together with the sliding member 30 from the first position P1 to the second position P2. The rotary member 60 rotates in a second rotation direction (counterclockwise in FIG. 10B) opposite to a first rotation direction (clockwise in FIG. 10B), serving as the card ejection direction D, while abutting against the lock stopper 11. When the card 200 is pressed toward the innermost portion of the housing 10, therefore, the rotary member 60 does not press the card 200 in the card ejection direction D as illustrated in FIG. 15.

Figure 10C:
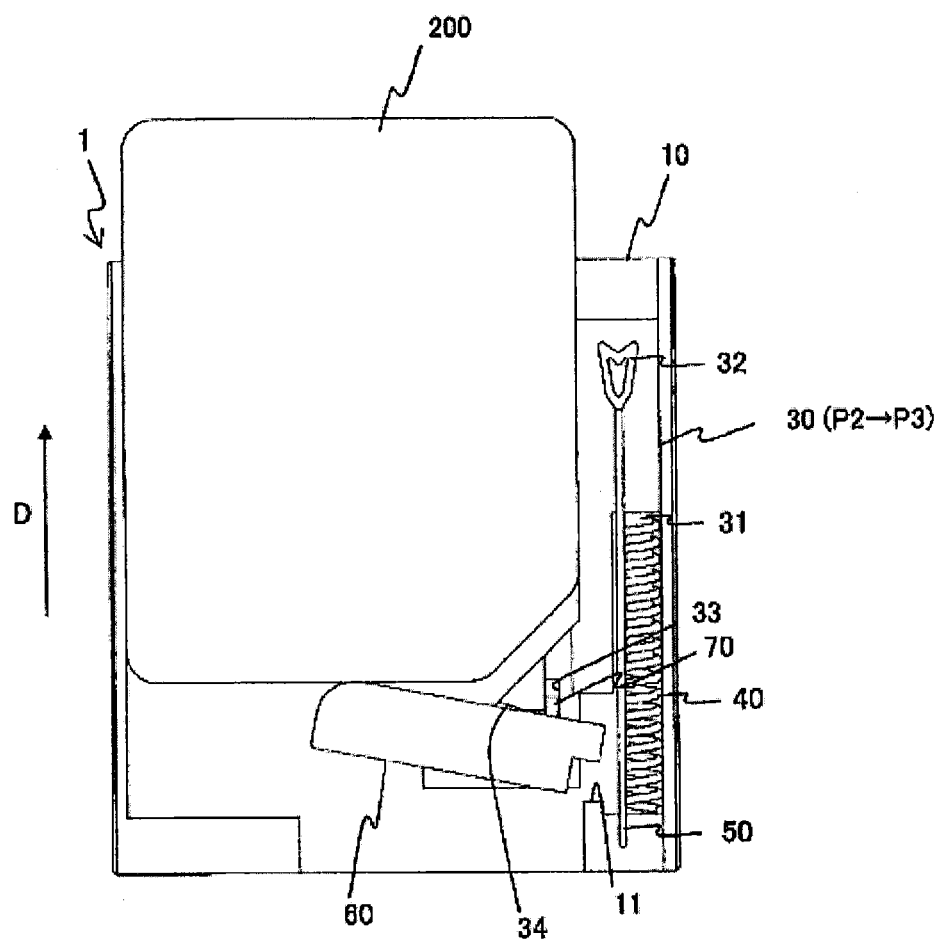

In the card connector 1 in a state in which the card is being ejected as illustrated in FIG. 10C, since the sliding member 30 is released from the lock by the pin 50 and the heart cam groove 32, the sliding member 30 is biased in the card ejection direction D by the coil spring 40, so that the sliding member 30 slides in the card ejection direction D.

The rotary member 60 is biased in the card ejection direction D (clockwise in FIG. 10C) by the torsion spring 70, so that the rotary member 60 rotates in the card ejection direction D. Thus, the rotary member 60 presses the card 200 in the card ejection direction D. Specifically, the rotary member 60 presses the middle part in the width direction of the card 200 at the second end of the card 200 closer to the innermost portion of the housing 10, thus ejecting the card 200.

Since the rotary member 60 abuts against the card 200 in this manner, the sliding member 30 does not contact directly the card 200 when the card is ejected. However, sliding of the sliding member 30 in the card ejection direction D causes the rotary member 60 supported by the sliding member 30 to slide in the card ejection direction D, so that the sliding of the sliding member 30 also causes the card 200 to be ejected.

Figure 10D:
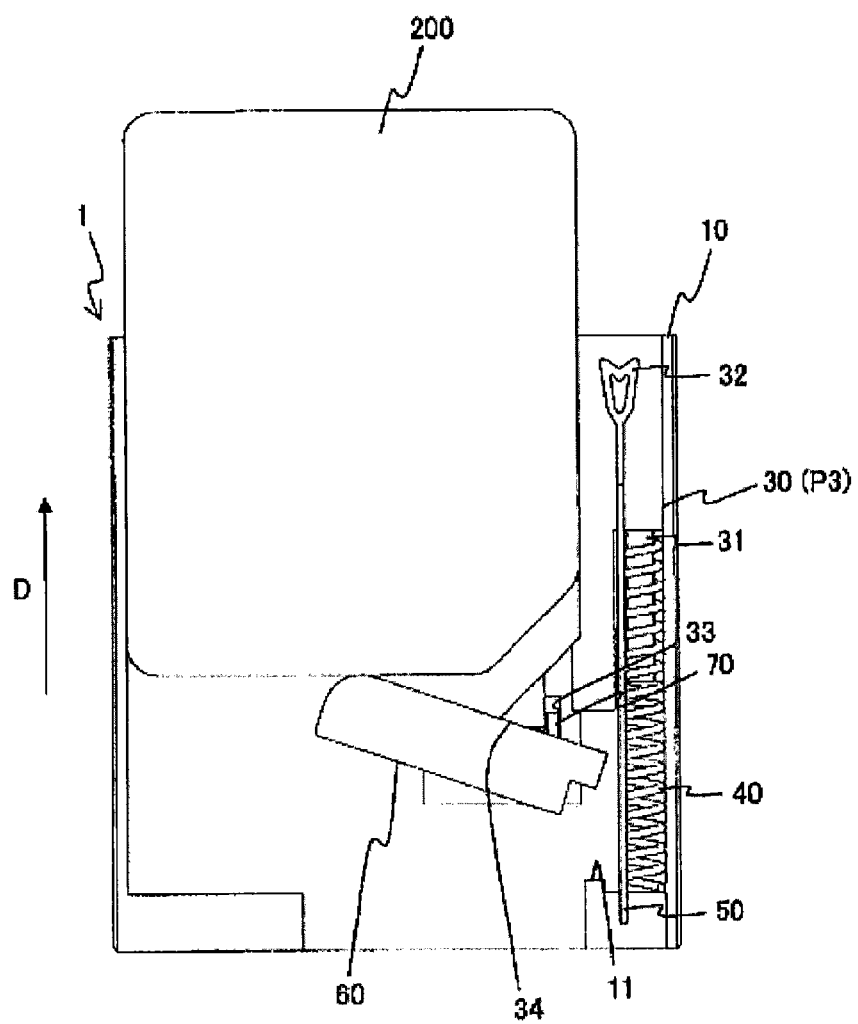

In the card connector 1 in the card ejected state illustrated in FIGS. 10D and 16, the sliding member 30 slides up to a position (third position P3) where the card 200 is removable. In the third position P3, the sliding member 30 is stopped by a stopper (not illustrated) disposed in the housing 10, for example, or by the coil spring 40 which has reached its maximum length, such that the sliding member 30 does not protrude from the housing 10 or the shell 20.

Referring to FIG. 17, the rotary member 60 abuts against the ejection restricting stopper 34 of the sliding member 30, so that the rotation of the rotary member 60 in the card ejection direction D (clockwise in FIG. 17) is restricted.

When the card 200 is inserted into the card connector 1, the sliding member 30 is pressed through the card 200 from a state similar to the card ejected state illustrated in FIG. 10D, for example. The sliding member 30 slides from the position (third position P3) where the card 200 is removable to the position (second position P2) where the sliding member 30 is locked to the housing 10, so that the card 200 is inserted into the housing 10 and is locked together with the sliding member 30.

Figure 18:
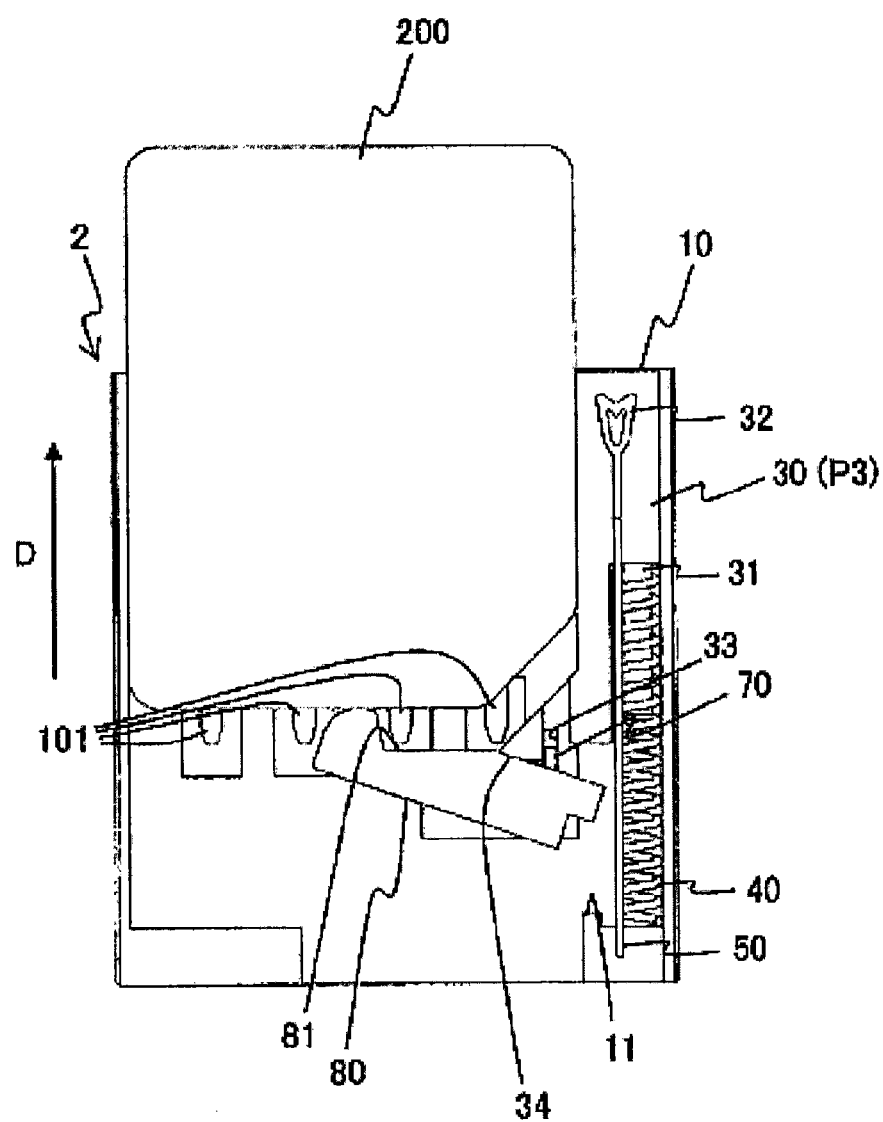
FIG. 18 illustrates a plan view of a exemplary card connector.

FIG. 18 illustrates an exemplary plan view of a card connector. An internal structure of a card connector 2 is illustrated in plan view in FIG. 18. In the card connector 2 of FIG. 18, a rotary member 80 differs in form from the rotary member 60 of the card connector 1. In FIG. 18, the other elements may be substantially the same or similar to those of the card connector 1 in FIG. 6.

The rotary member 80 includes a recess 81 configured to reduce interference with contacts 101 of the electronic apparatus 100, the contacts 101 being to come into contact with the card 200. The recess 81 opens in the card ejection direction D. Accordingly, the amount of rotation of the rotary member 80 increases, thus increasing the ejection amount of the card 200.

The card 200 is ejected by the sliding member 30 sliding together with the card 200 and the rotary member 80, which is rotatably supported by the sliding member 30 and presses the card 200 in the card ejection direction D. Accordingly, similar to when the sliding member 30 is lengthened in the card ejection direction D or the sliding amount of the sliding member 30 in the card ejection direction D is increased, protruding of the sliding member 30 from the housing 10 may be reduced. Moreover, the ejection amount of the card 200 may be increased.

The lock stopper 11 abuts against the rotary member 60 while the sliding member 30 is in the first position P1 (the locked state), thus restricting the rotation of the rotary member 60 in the card ejection direction D. Accordingly, a card ejecting operation of the rotary member 60 may be reliably restricted in the card locked state.

The lock stopper 11 is immovably disposed in, for example, the housing 10 and is configured to abut against a second end of the rotary member 60 on an opposite side to a first end of the rotary member 60 at which the rotary member 60 presses the card 200, being provided the protrusion 62 between the first end and the second end. The sliding member 30 is pressed through the card 200 when the card 200 is ejected, so that the sliding member 30 slides from the first position P1 to the second position P2. The sliding of the sliding member 30 from the first position P1 (locked state) to the second position P2 (unlocked state) causes the rotary member 60 to slide together with the sliding member 30 from the first position P1 to the second position P2, so that the rotary member 60 rotates in the second rotation direction (counterclockwise in FIG. 10B) opposite to the first rotation direction (clockwise in FIG. 10B), serving as the card ejection direction D, while abutting against the lock stopper 11. Consequently, when the card 200 is pressed to unlock the card in order to eject the card, the card ejecting operation of the rotary member 60 may be reliably restricted in a manner similar to that when the card is locked.

The sliding member 30 includes the ejection restricting stopper 34 which abuts against the rotary member 60 when the sliding member 30 is in the third position P3 (card ejected state) to restrict the rotation of the rotary member 60 in the card ejection direction D. Accordingly, the card ejecting operation of the rotary member 60 may be reliably restricted when the card is ejected.

The sliding member 30 abuts against the first end in the width direction of the card 200. The rotary member 60 rotates about the rotation axis, for example, the protrusion 62 positioned closer to the first end in the width direction of the card 200 and presses middle part in the width direction of the card 200 at the second end of the card 200 closer to the innermost portion of the housing 10, thus ejecting the card 200. Accordingly, the rotary member 60 may reliably press the card 200, such that the card 200 may be reliably ejected.

In the case where the recess 81 configured to reduce interference with the contacts 101 with which the card 200 is to come into contact is included in the rotary member 80 as illustrated in the card connector 2 of FIG. 18, the rotation amount of the rotary member 80 may be increased. Accordingly, the ejection amount of the card 200 may be increased.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A card connector comprising:
   a housing configured to receive a card;
   a sliding member configured to slide together with the card in a range including a first position, a second position and a third position, the sliding member being locked to the housing at the first position, the sliding member is unlocked from the housing at the second position, the card being removable at the third position;
   a rotary member, rotatably supported by the sliding member, configured to press the card in a card ejection direction;
   a lock mechanism configured to lock the sliding member in the first position to the housing and unlock the sliding member from the housing by sliding of the sliding member from the first position to the second position;
   a first biasing member configured to bias the sliding member in the card ejection direction;
   a second biasing member configured to bias the rotary member in the card ejection direction; and
   a lock stopper configured to abut against the rotary member when the sliding member is in the first position.

2. The card connector according to claim 1, wherein the lock stopper restricts rotation of the rotary member in the card ejection direction.

3. The card connector according to claim 1, wherein the sliding member slides from the first position to the second position by being pressed through the card when the card is ejected.

4. The card connector according to claim 1,
   wherein the sliding member abuts against a end in a width direction of the card, and
   wherein the rotary member rotates about a rotation axis positioned closer to the end and presses middle part in the width direction of the card and closer to the innermost portion of the housing.

5. The card connector according to claim 1, wherein the rotary member includes a recess configured to reduce interference with a contact which the card is to come into contact with.

6. The card connector according to claim 1, wherein the sliding member includes an ejection restricting stopper configured to abut against the rotary member when the sliding member is in the third position.

7. The card connector according to claim 6, wherein the sliding member restricts rotation of the rotary member in the card ejection direction.

8. The card connector according to claim 1, wherein the second position is closer to an innermost portion of the housing than the first position and the third position is closer to the outermost portion of the housing than the first position.

9. The card connector according to claim 8, wherein the lock stopper abuts against one end of the rotary member on an opposite side of the other end of the rotary member at which the rotary member presses the card, a rotation axis of the rotary member being positioned between the one end and the other end.

10. The card connector according to claim 8, wherein the rotary member slides from the first position to the second position along with the sliding member such that the rotary member rotates in a direction opposite to the card ejection direction while abutting against the lock stopper.

11. The card connector according to claim 8, wherein the lock stopper is immovably disposed.

12. A card connector comprising:
    a housing configured to receive a card;
    a sliding member configured to slide together with the card in a range including a first position, a second position and a third position, the sliding member being locked to the housing at the first position, the sliding member is unlocked from the housing at the second position, the card being removable at the third position;
    a rotary member, rotatably supported by the sliding member, configured to press the card in a card ejection direction;
    a lock mechanism configured to lock the sliding member in the first position to the housing and unlock the sliding member from the housing by sliding of the sliding member from the first position to the second position;
    a first biasing member configured to bias the sliding member in the card ejection direction; and
    a second biasing member configured to bias the rotary member in the card ejection direction,
    wherein the sliding member includes an ejection restricting stopper configured to abut against the rotary member when the sliding member is in the third position.

13. The card connector according to claim 12, wherein the sliding member restricts rotation of the rotary member in the card ejection direction.

14. An electronic apparatus comprising:
    a card connector configured to receive a card; and
    an internal circuit coupled to the card connector,
    wherein the card connector includes:
    a housing configured to receive a card;
    a sliding member configured to slide together with the card in a range including a first position, a second position and a third position, the sliding member being locked to the housing at the first position, the sliding member is unlocked from the housing at the second position, the card being removable at the third position;
    a rotary member, rotatably supported by the sliding member, configured to press the card in a card ejection direction;
    a lock mechanism configured to lock the sliding member in the first position to the housing and unlock the sliding member from the housing by sliding of the sliding member from the first position to the second position;
    a first biasing member configured to bias the sliding member in the card ejection direction;
    a second biasing member configured to bias the rotary member in the card ejection direction; and a lock stopper configured to abut against the rotary member when the sliding member is in the first position.

15. The electronic apparatus according to claim 14, wherein the second position is closer to an innermost portion of the housing than the first position and the third position is closer to the outermost portion of the housing than the first position.

16. The electronic apparatus according to claim 14, wherein the lock stopper restricts rotation of the rotary member in the card ejection direction.

* * * * *

UNITED STATES PATENT AND TRADEMARK OFFICE
CERTIFICATE OF CORRECTION

| | | |
|---|---|---|
| PATENT NO. | : 8,944,833 B2 | |
| APPLICATION NO. | : 13/679333 | |
| DATED | : February 3, 2015 | |
| INVENTOR(S) | : Koki Takahashi et al. | |

It is certified that error appears in the above-identified patent and that said Letters Patent is hereby corrected as shown below:

Claims

Claim 4, Column 7, Line 54

Delete "a end" and insert --an end--, therefor.

Signed and Sealed this
Twenty-fourth Day of November, 2015

Michelle K. Lee
*Director of the United States Patent and Trademark Office*